United States Patent [19]

Gantley

[11] 4,138,304

[45] Feb. 6, 1979

[54] WAFER SAWING TECHNIQUE

[75] Inventor: Francis C. Gantley, Fulton, N.Y.

[73] Assignee: General Electric Company, Auburn, N.Y.

[21] Appl. No.: 848,129

[22] Filed: Nov. 3, 1977

[51] Int. Cl.² ............... B24B 1/00; B32B 31/00; B28D 1/04

[52] U.S. Cl. ............... 156/268; 29/412; 29/424; 51/283 R; 125/13 R; 83/14

[58] Field of Search ............... 156/268, 250, 344; 29/559, 424, 412; 125/13 R; 51/283

[56] References Cited

U.S. PATENT DOCUMENTS

| | | | |
|---|---|---|---|
| 3,081,586 | 3/1963 | Gersbach | 51/283 |
| 3,152,939 | 10/1964 | Borneman et al. | 125/13 R |
| 3,247,589 | 4/1966 | Burns | 29/610 |

Primary Examiner—Douglas J. Drummond
Attorney, Agent, or Firm—Robert J. Mooney; Stephen B. Salai

[57] ABSTRACT

A method for dividing a semiconductor wafer into pellets includes attaching the wafer to a vinyl membrane with a coupling material which adheres more tenaciously to the membrane than to the pellets and sawing completely through the wafer and at least partially through the coupling material to separate the wafer into discrete pellets. In accordance with a preferred method, the membrane is at least slightly cut by the saw to insure complete division of the wafer. The pellets are readily removed from the coated membrane without any residues remaining thereon from the coupling material. A resinous vinyl coupling material is preferred.

20 Claims, 11 Drawing Figures

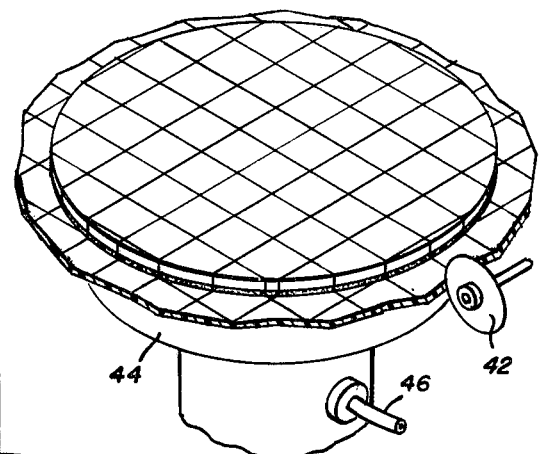
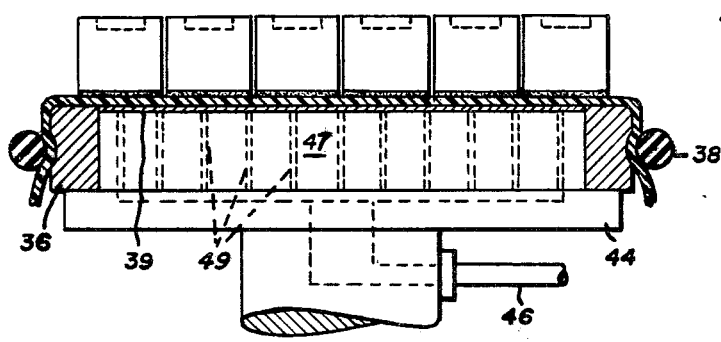
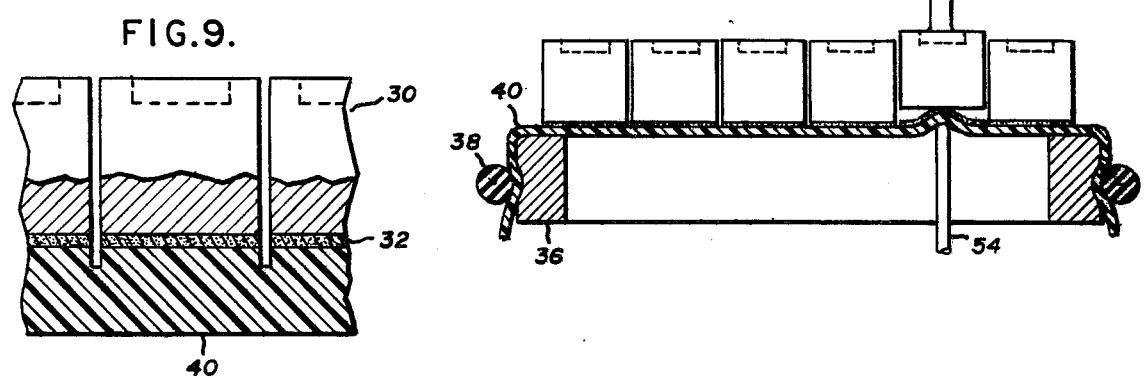
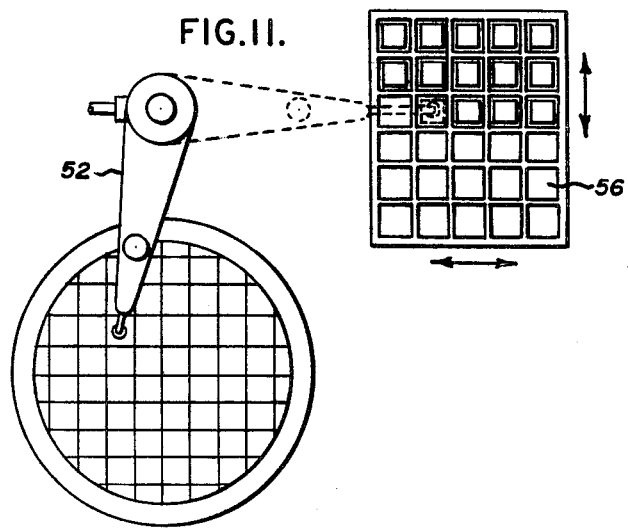

WAFER SAWING TECHNIQUE

This invention relates in general to semiconductor processing and, more particularly, to a method for subdividing a semiconductor wafer into pellets.

It is almost the universal practice to form relatively small semiconductor devices in large numbers on wafers of silicon or other semiconductor materials and then to divide the wafers into a plurality of pellets, each of which is a semiconductor device. In this way, simultaneous processing of a great number of devices may be accomplished with attendant saving in time and expanse. The subdivision of wafers, which wafers may be quite thin and brittle, has heretofore been accomplished in a number of ways, each of which suffers from one or more disadvantages. Quite commonly, wafers are scribed along lines which define the boundaries of the individual pellets, the scribing serving to weaken the wafer along the scribed lines, and the wafers are then broken into individual pellets. This breaking is oftentimes accomplished by placing the scrived wafer on a resilient surface and deforming the wafer, for example, by rolling a rigid member over the surface opposite the resilient surface to fracture the wafer along the scribed lines. This method, while relatively inexpensive and readily performed, suffers from the disadvantage that the pellets themselves are oftentimes subjected to stresses, during the fracturing process, which adversely affect the characteristics of the completed devices. Similarly, where it is desirable, for example, to passivate certain portions of the wafers, and especially the edges thereof, with brittle passivating materials such as glass or the like, undesirable degradation, for example, cracking of the passivation, oftentimes occurs during the breaking of the wafer into pellets.

In an attempt to partially solve these and other associated problems, it has been suggested to saw rather than scribe the wafer prior to dividing by breaking. One prior art method for dividing wafers into pellets involves sawing partially through the wafer and then completely dividing the wafer into pellets by breaking the partially sawed wafer as has been hereinabove described in conjunction with scribing. This method produces somewhat less stress on the pellets than the foregoing scribing method of division, but is still not an optimum technique.

Sawing completely through the wafer has been recognized as a partial solution to at least some of these problems. In the past, sawing all the way through the wafer has been accomplished by mounting the wafer on a support material such as graphite, with an intermediate adhesive layer such as wax, and then sawing completely through the wafer and at least partially into the wax for dividing the wafer into pellets. It has been a disadvantage of this method that, first, it is difficult to provide adequate adhesion of the pellets to the support therefor, both during and after the sawing operation; and second, it is difficult to both readily remove the pellets from the adhesive and to do so without damaging them. Generally, wax residue must be removed from the pellets by dissolving it with an appropriate solvent. This requires that the pellets be subsequently handled in what is commonly referred to as the loose pellet form, that is, not conveniently mounted to any support, but rather loose in a container. This type of handling suffers from several disadvantages. It is costly, it is time consuming, it increases the likelihood of damaging the pellets during operations subsequent to dividing the wafers, it requires that the pellets be individually oriented for further processing, and, not the least significant, it exposes the pellets to damage by the solvents used to remove the wax residue.

Accordingly, it is an object of this invention to provide an improved method for dividing a semiconductor wafer into pellets which overcomes the disadvantages of prior art methods.

It is another object of this invention to provide an improved method for subdividing a semiconductor wafer into pellets which improves the quality of the pellets produced by reducing the stresses created in the pellets during the dividing operation.

It is yet another object of this invention to provide an improved method for subdividing a semiconductor wafer into pellets which allows for the subsequent automatic or semiautomatic handling of the pellets by virtue of the fact that they are not loose, but rather are removably mounted on a carrier which is readily compatible with subsequent processing by automatic equipment.

It is still another object of this invention to provide an improved method for subdividing a semiconductor wafer into pellets which does not require any potentially, pellet-damaging solvent to remove adhesive materials subsequent to dividing.

It is a further object of this invention to provide an improved method for subdividing a semiconductor wafer into pellets which allows the wafer to be sawed all the way through so as to eliminate the necessity for breaking the wafer into pellets.

Briefly stated, and in accordance with a presently preferred embodiment of the invention, a semiconductor wafer is divided into a plurality of pellets by applying a strippable vinyl coating to the wafer, adhering the coated wafer to a membrane, sawing all the way through the wafer and at least partially through said coating, and removing the pellets from the membrane.

In accordance with one aspect of the invention, the strippable coating may be a resinous vinyl coating which is readily applied to the wafer in liquid form, and then cured. Advantageously, the liquid coating may be simultaneously evenly distributed over the surface of the wafer, and cured by spinning the wafer after the application of the coating in liquid form.

The wafer may be readily attached to the membrane by the application of heat to the juxtaposed combination of membrane and coated wafer, and the combination then sawed. After sawing, the individual pellets remain attached to the membrane and in the same orientation as they had when in wafer form. Subsequent removal of the pellets and mounting thereof is readily accomplished by automatic or semiautomatic methods.

The features of the invention which are believed to be novel are pointed out with particularity in the appended claims. The invention itself, however, both as to its organization and method of operation together with further objects and advantages thereof may best be understood by reference to the following description taken in conjunction with the accompanying drawing in which:

FIG. 7 is a view of the sawing of a wafer;

FIG. 8 is a view of a wafer after division into pellets by sawing while remaining attached to a membrane in accordance with this invention;

FIG. 9 is an enlarged view of a portion of FIG. 8 showing the depth of saw cut with particularity.

FIGS. 10 and 11 are diagrammatic views of a method and apparatus for removing pellets from a membrane in accordance with this invention.

Figure 1:
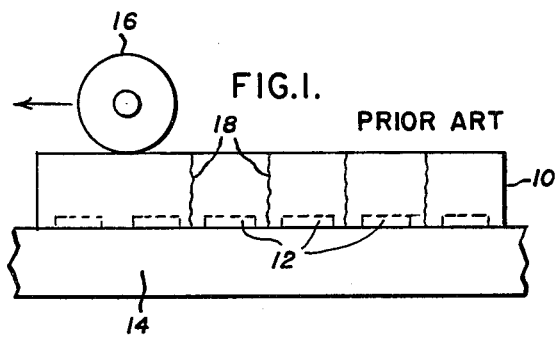
FIG. 1 is a view of a prior art method for dividing a semiconductor wafer into pellets.

Referring now to FIG. 1, there is illustrated a prior art method for dividing a semiconductor wafer including a plurality of semiconductor devices therein into a plurality of pellets each of which comprises a single device. A wafer 10 includes a plurality of regions 12 therein forming a like plurality of semiconductor devices upon division. While relatively simple devices are illustrated in FIG. 1 and in the remaining Figures, for purpose of enabling a ready understanding of both the prior art and the improvement of this invention, it will be understood that the invention is widely applicable to dividing into pellets, wafers including devices ranging from the most simple two-region diodes to integrated circuits of vast complexity including many thousands of elements.

Wafer 10 is initially scribed, as for example, by laser scribing, to weaken the crystal along intersecting lines which will be the lines along which fracture of the wafer will subsequently occur. Typically, after scribing, the wafer is placed upon resilient mat 14 and rolled by member 16 to cause fracture to take place along lines 18. The individual pellets may be picked up by any convenient means and further processing thereof accomplished.

In accordance with preferred pelletizing according to the prior art as described by U.S. Pat. No. 3,918,150, the wafer may advantageously be mounted to a membrane before dividing and the membrane stretched after dividing to separate the pellets and to maintain them attached to and usefully oriented on the membrane for subsequent removal.

The method of FIG. 1 has become widely employed in the semiconductor industry despite the several disadvantages thereof in certain applications as hereinabove identified.

Figure 2:
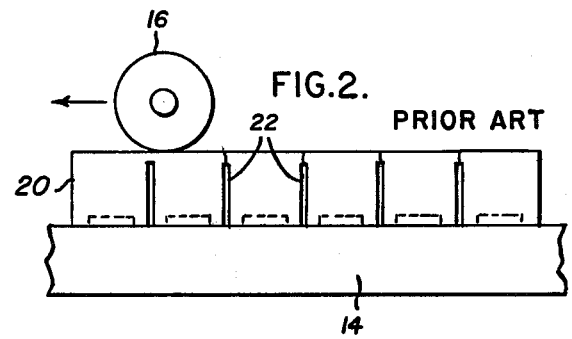
FIG. 2 is another view of a prior art method for dividing a wafer into pellets.

FIG. 2 illustrates another prior art method for dividing wafers into pellets which attempts to eliminate some of the problems associated with the method of FIG. 1. A wafer is sawed part of the way through as indicated by slots 22. Since the wafer remains intact, the sawing is easily accomplished by holding it in any well known manner as, for example, by vacuum chuck or the like and sawing.

The same saws as have heretofore been utilized for dividing wafers in accordance with the above method and the method hereinbelow described may be utilized in accordance with the improved method of the instant invention.

After sawing, the wafer is inverted and placed on resilient mat 14 which may be of the same characteristics as like-numbered mat 14 of FIG. 1. A roller 16 is employed in a similar manner as like-numbered roller 16 of FIG. 1 to fracture wafer 20 into a plurality of pellets. While the rolling of wafer 20 and of wafer 10 of FIG. 1 are illustrated as being accomplished from opposite sides with respect to the devices formed therein, it will be understood by those skilled in the art that consistent with not damaging the devices formed in the wafers, rolling and the attendant scribing and partial sawing operations may be performed from either side of the wafer.

Figure 3:
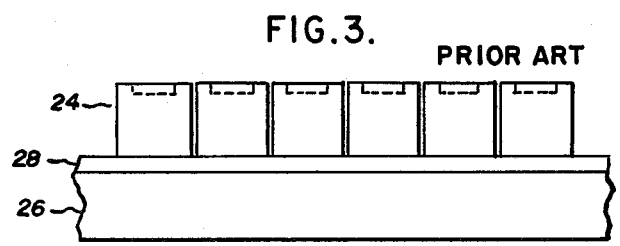
FIG. 3 is a view of yet another method for dividing a semiconductor wafer into pellets in accordance with the prior art.

FIG. 3 illustrates a wafer 34 which has already been divided into pellets, attached to a support 26 by an adhesive layer 28. In accordance with this prior art method for dividing a wafer into pellets, wax is oftentimes utilized as an adhesive. Wax is usefully employed insofar as it is readily applied in a relatively thick layer for permitting the sawing of the wafer into completely separate pellets. Wax, however, adheres tenaciously to pellets 24 after dividing and the pellets may not be directly utilized after revoval from support 26 following sawing. A wax residue remains on the pellets and they must be cleaned prior to mounting or further use. Accordingly, a solvent is typically employed to remove the wax residue from pellets 24. It has long been a problem to identify a solvent which completely removes wax from the pellets without damaging them. Still further, even if the pellets could be completely cleansed of the wax residue after sawing, they are, nevertheless, no longer held in place on a carrier such that they can be automatically handled for subsequent processing. They must be individually handled as loose pellets at consequent increase in the complexity and cost of handling.

Figure 4:
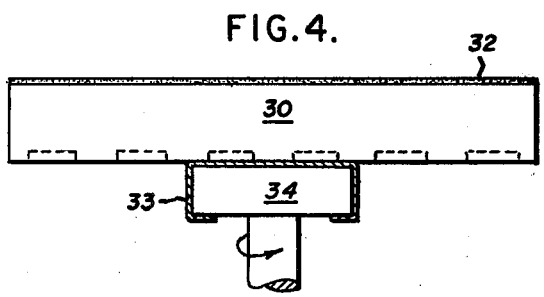
FIG. 4 is a view of a semiconductor wafer having a plurality of devices therein and coated with a coupling material in accordance with the teachings of this invention.

FIG. 4 illustrates the first step in an improved method for dividing a wafer into pellets in accordance with this invention. It will be understood that prior to the step illustrated in FIG. 5, the wafer has undergone the required processes for forming therein a plurality of semiconductor devices as, for example, the steps of masking, diffusion, crystal growth, annealing, and the like, as well as testing if desired. In accordance with one embodiment of the invention, the individual devices may be tested while the wafer is intact, marked, or the relevant results otherwise stored; and the pellets, which remain in the same relative positions after sawing, sorted according to the test results.

After the foregoing processing, wafer 30 is provided with a layer of ductile coating material 32 on one surface thereof. Preferably, coating 32 is applied to the side of wafer 30 opposite the side on which devices are formed. Conventionally, one side of a semiconductor pellet is adapted as, for example, by the provision of a metal layer (not shown) thereon, to be directly connected to an electrical contact. Coating layer 32 is preferably applied to the metal layer. One advantageous method for applying layer 32 is to apply the coating material, for example, with a dropper, in a liquid form, and then to evenly distribute it over the surface of the wafer by spinning the wafer as for example on fixture 34 to which wafer 30 may be temporarily attached by adhesive holding layer 33, or the like. Adhesive layer 33 may conveniently be double-sided adhesive tape which may be readily replaced as required to avoid contaminating wafer 30. Spinning the wafer both uniformly distributes the coating over the surface of the wafer and cures the coating. Preferably, a final thickness of coating on the order of 1–2 mils is desired for providing both secure wafer and pellet holding to a membrane and ready removal of the pellets after pelletizing.

The coating 32 is preferably a ductile material such as a synthetic vinyl resin having proper stretchability and the other properties hereinafter set forth. Typical examples of suitable resins include: Coveriac SC267, SC250L, SC249, SC3808, and SC515, all manufactured by Spraylat Corporation, Mount Vernon, N.Y., These and other suitable coatings are commonly known in the art as strippable coatings due to their characteristic of forming a deformable plastic layer upon curing which is readily removable from the surface to which it is applied by peeling the coating from the surface, or in the case of the instant invention, by peeling the pellet from the coated membrane. The characteristics of the coating and the membrane are similar, and the coating is to be considered not as an adhesive which sticks the wafer to the membrane, but rather as a material which is of like character with the membrane and, which, upon heating of the combination, becomes part thereof, adhering more tenaciously to the membrane than to the wafer, or subsequently, to the pellets. When the pellets are removed from the membrane, the coating does not adhere to the pellets, and it is not necessary to perform any additional steps for the removal of residue from the pellets.

While the method of this invention is widely applicable, certain surfaces are to be avoided for achieving good holding of the pellets to the membrane. For example, exceptionally smooth, highly polished surfaces have been found to provide, in combination with the strippable coating, inadequate holding strength between the wafer and the membrane to insure that the pellets are not loosened during sawing and, therefore, likely to fall off after being completely separated. Accordingly, it is unnecessary and, in fact undesirable, to provide a highly polished surface on the wafer prior to attaching the wafer to the membrane. A suitable surface is provided, for example, by the application of a conductive metal contact as, for example, gold, by the process of vacuum deposition followed by alloying or sintering. It is emphasized that the requirement for a surface which is not polished to a high degree does not impose an additional burden on those desiring to practice this invention, but, rather, it eases the requirements on the degree of smoothness of the metal contact oftentimes found on semiconductor devices of the type to which this invention is directed. The techniques commonly used for preparing the surfaces of silicon wafers for the application of metal layers are well known. Conventionally, the silicon surface is lapped or sandblasted prior to the deposition thereon by a vacuum deposition process of a gold or other suitable metal layer. Vacuum deposition as used herein includes similar processes such as electron beam evaporative plating, other types of evaporative plating, such as those wherein a coated filament is heated to create a metal vapor, and any of the other types of plating commonly employed in the art. After plating, the coated wafer is oftentimes heated or sintered to alloy the metal layer to the silicon wafer. In some cases, more than one metal layer may be provided, as exemplified by the commonly utilized combination of chromium, nickel, and silver.

While examples of typical electrode structures and methods for the formation thereof have been hereinabove set forth, it is to be understood that no particular structure or method is required in conjunction with the techniques of this invention, but rather the invention is widely applicable and tolerant of a wide variety of contacts essentially as described, so long as a surface is provided having a degree of roughness such that a strippable coating will adhere thereto.

Figure 5:
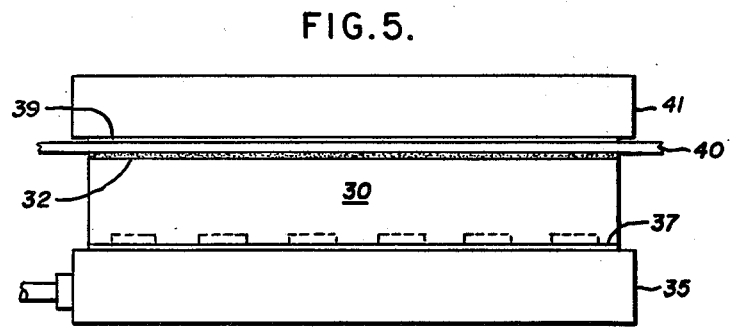
FIG. 5 is a view of means for mounting the coated wafer to a membrane in accordance with this invention.

FIG. 5 illustrates the attaching of coated wafer to membrane 40. Wafer 30 is temporarily held on vacuum fixture 35. Preferably, protective member 37 which may conveniently be a soft paper member is placed between wafer 30 and fixture 35 for preventing damage to the surface of the wafer. Membrane 40 is placed in contact with coating 32. A second soft paper element 39 is placed on the opposite surface of membrane 40 from wafer 30. Heat is applied by heated element 41 to the combination of wafer 30 and membrane 40 through paper element 39. Paper element 39 is useful in subsequent steps as will be described. Membrane 40 is bonded to coated wafer 30, a stronger bond being created between the coating and the membrane than between the coating and the wafer. Due to the similarity of composition of the coating and the membrane, the nature of the bond between the coating and the membrane is not of the nature of an adhesive bond, but rather a continuous layer of vinyl material is formed including the membrane and the previously applied coating layer.

Figure 6:
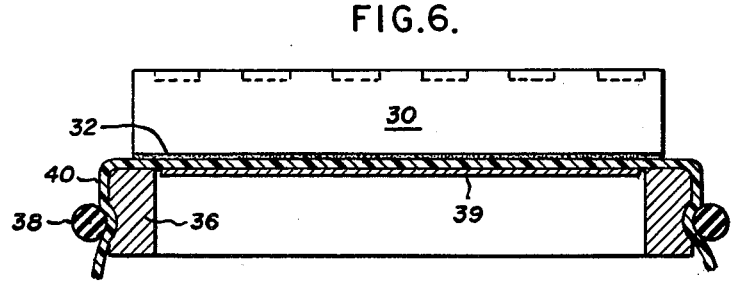
FIG. 6 is a view of a wafer mounted to a membrane on a fixture ready for sawing in accordance with this invention.

FIG. 6 illustrates the coated wafer mounted to membrane 40 which in turn is mounted on a carrying frame 36 for easy handling. The membrane is preferably of a plastic material which is of carefully controlled and uniform thickness so as to permit sawing to a preset depth without cutting through the membrane. More preferably, the membrane is a vinyl membrane which is at least slightly stretchable for mounting to frame 36 by a convenient means exemplified by O-ring 38. A preferred membrane for use with the processes of this invention is available from the Semiconductor Equipment Corporation, Newbury Part, Calif. and, is known in the semiconductor industry as "Hugle Membrane". The membrane is stretchable, is manufactured of vinyl, and is available in a variety of thicknesses, 4 mil thick membrane being usefully employed herein.

As has been hereinabove described, the wafer 30 has been coated with layer 32 of strippable coating. The coated wafer may be stored for a convenient time prior to mounting on membrane 40. Mounting is accomplished by physically placing the membrane and the coated wafer in face-to-face relationship, the coated surface of the wafer abutting the surface of the membrane, and applying heat to the opposite side of the wafer. Heat may be applied for example, by placing a heated member against the surface of the membrane either directly, or through a thin paper element, or the like, to prevent the heat source from sticking to the membrane. The wafer may be attached to the membrane prior to mounting the combination on a frame 36. As mounted to membrane 40, and the combination mounted on frame 36, the wafer is prepared for sawing. While frame 36 is illustrated as being a ring-shaped frame, which frame is well suited to subsequent automated or semiautomated pellet removal, other types of support for the combination of the membrane and the wafer may be employed. For example, a solid support having small holes therethrough for communicating a vacuum from the lower surface to the upper surface may be used. Where a hollow ring-shaped frame is used, membrane 40 is preferably slightly stretched for insuring that a relatively flat surface is obtained. Ring 38 serves two purposes: it holds membrane 40 firmly onto the frame 36 and it prevents the edges of the membrane from coming in contact with the saw.

As has been hereinabove described, sawing of wafers per se and in fact sawing all the way through wafers are known in the art. Saws are available which have been used in the past in conjunction with the aforementioned wax mounted sawing method which are suitable for use in conjunction with this invention. Such saws are manufactured by Micro Automation, Inc., Santa Clara, CA, Model 1000 Programmed Dicing Saw; DAI-ICHI SEITOSHO Co., Ltd., Tokyo, Japan, Model DAD 2 H Automatic Scriber Dicer; and Tempress Division of Sola Basic Industries, Model 602 Dicing Saw. These saws exemplify the characteristics which are required to practice this invention, and are not meant to embody an exclusive list. They share the common characteristics of being accurately controlled as to depth of cut, direction of cut, speed of cut, and have the ability to cut silicon or other semiconductor materials.

FIG. 7 illustrates the sawing of wafer 30 by saw 42. The wafer is mounted to the membrane as described above and the combination is presented to the saw by temporarily mounting on a chuck 44 by convenient means as, for example, by vacuum holding means 46. The actual cutting of wafer 30 may be performed either by moving the saw relative to the fixed-chuck-mounted wafer, or by holding the saw fixed and moving the wafer. The first of these techniques is preferred for sawing all of the necessary cuts for dividing the wafer in one direction. Rotation of the wafer with respect to the saw is then accomplished by rotating the chuck precisely 90 degrees so that the remaining cuts may be made. Several of the saws mentioned above have the capability for performing the foregoing operations automatically.

FIG. 8 illustrates in more detail the wafer after sawing and also the mounting of the wafer for sawing. Ring 36 fits over upper portion 47 of chuck 46 and is held in place thereon by a vacuum which is communicated to the membrane through passages 49 and which is evenly distributed by paper element previously applied. Also facilitates the removal of the membrane from the vacuum chuck. It has been found that without paper element the membrane tends to stick to the smooth surface of the chuck.

The depth of cut made by saw 42 is at least all the way through wafer 30 and preferably at least partially through membrane 40. In an exemplary embodiment of this invention wherein excellent results are obtained, a membrane thickness of 4 mils is employed, a strippable coating of 1 mil thickness is used to mount the wafer to the membrane, and any desired wafer thickness may be used. A saw cut is made which extends completely through both the wafer and the coating and 1 mil into the membrane. It has been found that the membrane is not adversely affected by this slight cutting insofar as its ability to securely hold the pellets is concerned and the pellets are found to be both completely divided and readily removed from the membrane as will hereinbelow be described.

Saw 42 preferably is a high speed diamond blade saw having a blade width between about 1.0 and 1.1 mils so that the spacing between pellets on a semiconductor wafer may be small and the waste represented thereby reduced to the extent possible.

FIGS. 10 and 11 depict apparaus for removing the separated pellets from membrane 40 after sawing. It is emphasized that pellets after sawing are retained on membrane 40 in the same orientation that they had on the wafer and in the same relative position. This allows for test of the pellets while still in wafer form with sorting accomplished after pelletizing as a function of the earlier test results. Pellet pick up may be accomplished in a number of ways. For example, a vacuum pick-up arm 52 may be employed to lift the individual pellets from the membrane with an optional pointed member 54 being employed to raise the pellet to be lifted above the level of the other pellets while at the same time partially separating the pellet from the membrane as illustrated in FIG. 10. Alternatively, the pellets may be lifted by a fixture which grasps the pellets at the edges thereof. After removal of the pellets from membrane 40 by pick-up arm 52, the pellets may conveniently be deposited in receptacle 56 according to a sorting procedure accomplished either at the time of removal from the membrane or at some earlier time. In order to retain the advantages of the instant invention, the pellets are preferably maintained in the same respective orientation by the pick-up arm so that subsequent mountdown may be accomplished by automatic means without reorienting where desired.

While the invention has been illustrated in connection with a presently preferred embodiment thereof, it will be understood by those skilled in the art that certain modifications and changes may be made without departing from the true spirit and scope of the invention. For example, while the drawings and the accompanying description have described a sawing method in conjunction with square pellets, other straight-sided pellets may be accommodated by the method taught herein along with arbitrarily-shaped, curved pellets where the constraints of the particular saw which is selected allow. Accordingly, these and other modifications and changes which are apparent to those skilled in the art are intended to be covered by the appended claims.

What is claimed is:

1. A method for dividing a semiconductor wafer into pellets comprising:
   providing a flexible membrane;
   coating a surface of said wafer with a layer of coupling material which adheres more tenaciously to said membrane than to said wafer;
   bonding said wafer to said membrane; and
   dividing said wafer into pellets by sawing completely through said wafer and at least partially through said layer.

2. The method of claim 1 further comprising removing said pellets from said membrane to a storage medium while maintaining the relative orientation of said pellets.

3. The method of claim 1 wherein said coating step comprises applying said coupling material in a thin layer and at least partially curing said coupling material.

4. The method of claim 3 wherein said applying and curing comprises applying said coupling material in liquid form and spinning said wafer to distribute said coupling material in a thin layer and to at least partially cure said coupling material.

5. The method of claim 1 wherein said coupling material is a resinous vinyl material.

6. The method of claim 1 wherein said membrane is a vinyl membrane.

7. The method of claim 6 wherein said membrane is at least slightly stretchable.

8. The method of claim 7 wherein said coupling material is a vinyl coupling material.

9. The method of claim 8 wherein said coating step comprises applying said coupling material to said wafer in a thin layer and at least partially curing said coupling material.

10. The method of claim 9 wherein said applying and curing comprises applying said coupling material in liquid form and spinning said wafer to distribute said coupling material in a thin layer and to at least partially cure said coupling material.

11. The method of claim 10 wherein bonding said wafer to said membrane comprises placing said coated wafer and said membrane in face-to-face relationship and heating the interface therebetween so as to bond said wafer to said membrane.

12. The method of claim 11 wherein said heating comprises heating the surface of said membrane opposite said wafer.

13. The method of claim 12 wherein said heating comprises heating through a thin porous layer.

14. The method of claim 13 wherein said thin porous layer comprises a paper layer.

15. The method of claim 13 wherein said sawing comprises sawing completely through said layer of coupling material.

16. The method of claim 15 wherein said sawing comprises sawing at least partially through said membrane.

17. The method of claim 16 further comprising removing said pellets from said membrane.

18. The method of claim 17 wherein said removing comprises removing by lifting said pellets with a vacuum pick-up means.

19. The method of claim 18 further comprising placing said pellets in storage means.

20. The method of claim 19 wherein said placing includes maintaining the same relative orientation of said pellets in said storage means as on said wafer.

* * * * *